(12) United States Patent
Jung et al.

(10) Patent No.: US 6,664,031 B2
(45) Date of Patent: Dec. 16, 2003

(54) PROCESS FOR FORMING PHOTORESIST PATTERN BY USING GAS PHASE AMINE TREATMENT

(75) Inventors: Jae Chang Jung, Kyoungki-do (KR); Cha Won Koh, Kyoungki-do (KR); Jin Soo Kim, Daejeon-shi (KR); Sung Eun Hong, Sungnam-shi (KR); Keun Kyu Kong, Kwangju-shi (KR); Ki Ho Baik, Ichon-shi (KR)

(73) Assignee: Hynix Semiconductor Inc, Kyoungki (KR)

( * ) Notice: Subject to any disclaimer, the term of this patent is extended or adjusted under 35 U.S.C. 154(b) by 126 days.

(21) Appl. No.: 09/852,377

(22) Filed: May 10, 2001

(65) Prior Publication Data

US 2001/0053590 A1 Dec. 20, 2001

(30) Foreign Application Priority Data

Jun. 13, 2000 (KR) ........................................ 2000-32444

(51) Int. Cl.$^7$ ................................................ G03F 7/26
(52) U.S. Cl. ........................ 430/325; 430/322; 430/330
(58) Field of Search ................................. 430/322, 325, 430/324, 330

(56) References Cited

U.S. PATENT DOCUMENTS 6,057,084 A * 5/2000 Mohondro ................... 430/330
6,096,484 A * 8/2000 Azuma ........................ 430/325

FOREIGN PATENT DOCUMENTS

GB  2171530  * 8/1986

* cited by examiner

Primary Examiner—Kathleen Duda
(74) Attorney, Agent, or Firm—Marshall, Gerstein & Borun LLP

(57) ABSTRACT

A process for producing a photoresist pattern is disclosed. In particular, the disclosed process for forming a photoresist pattern reduces or prevents poor quality photoresist patterns formation, especially when a high light absorbing (i.e., low transmittance) photoresist resin is used. In one aspect, a photoresist film which has been exposed to light is treated with a gas phase basic compound to produce a substantially vertical photoresist pattern.

12 Claims, 3 Drawing Sheets

PROCESS FOR FORMING PHOTORESIST PATTERN BY USING GAS PHASE AMINE TREATMENT

BACKGROUND OF THE INVENTION

TECHNICAL FIELD

A process for forming a photoresist pattern is disclosed. In particular, a process for forming a photoresist pattern is disclosed that comprises the steps of treating an exposed photoresist resin with a basic gas phase compound under conditions sufficient to form a substantially vertical pattern.

DESCRIPTION OF THE BACKGROUND ART

Current methods allow production of 150 nm L/S photoresist patterns using 248 nm wavelength light (e.g., KrF exposer). However, formation of high quality photoresist patterns smaller than 150 nm L/S have been relatively unsuccessful. For example, use of short wavelength light sources, such as ArF (193 nm), $F_2$ (157 nm), EBW (13 nm), with low transmittance photoresist resins have resulted in poor quality patterns. And photoresist resins that are typically used with i-line (365 nm) and KrF (248 nr) light sources have a relatively high absorbance of 193 nm wavelength light because they typically contain aromatic compounds. Therefore photoresist resins comprising aromatic compounds are not suitable to use with ArF light source. Photoresist compositions comprising acrylic or alicyclic resins developed for ArF light source still have a relatively high absorbance of 193 nm wavelength light even though they contain no aromatic compounds. In addition, 157 nm L/S photoresist patterns produced from photoresist resins comprising typical organic compounds are generally of a poor quality because C—H, C=C, C=O bonds and aromatic compounds readily absorb 157 nm wavelength light.

Use of conventional chemically amplified photoresist resins having a low transmittance result in majority of light absorption in the upper portion of the photoresist resin and a significantly lower amount of light reaching the bottom portion of the photoresist resin. Thus, a higher amount of acid is generated in the upper portion of the photoresist resin compared to the lower portion of the photoresist resin. This acid gradient can result in a bulk slope profile pattern as shown in FIG. 1b.

One method of overcoming some of the above described problems is to use a photoresist resin which has a relatively high transmittance. Using a high transmittance photoresist resin results in a substantially equal amount of light reaching both the upper and bottom portions of the photoresist resin, which allows formation of a desired vertical pattern as shown in FIG. 1a. While efforts have been made to produce a fine photoresist pattern (i.e., 150 nm L/S or better) using a photoresist resin and light wavelengths of 157 nm ($F_2$) and 13 nm (EUV), these efforts have not been successful thus far.

SUMMARY OF THE DISCLOSURE

A process for forming a substantially vertical photoresist pattern is disclosed even when a highly light absorbing (i.e., low transmittance) photoresist resin is used.

DETAILED DESCRIPTION OF THE PREFERRED EMBODIMENTS

Figure 1A:
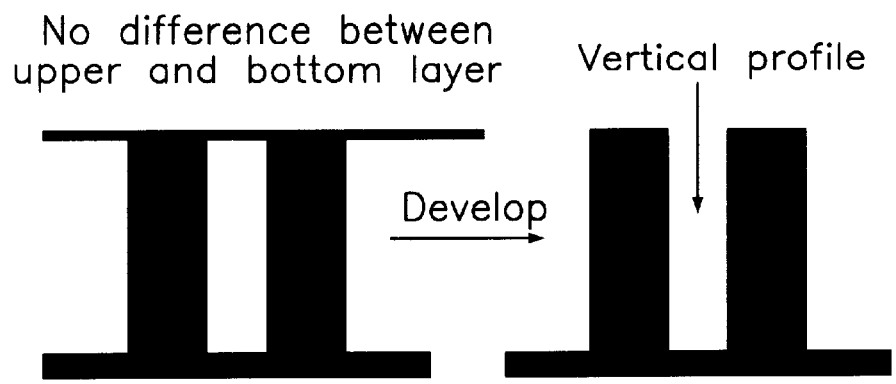
FIG. 1a shows a pattern profile obtained using a low light absorbance photoresist resin.

A process is disclosed for forming a photoresist pattern by treating a photoresist film with a gas phase basic compound under conditions sufficient to produce a substantially vertical photoresist pattern. Without being bound by any theory, it is believed that the gas phase basic compound neutralizes at least a portion of the acid generated in the upper portion of the photoresist film. This is believed to be particularly useful for photoresist resins having a relatively high light absorbance.

As used herein, the term "treating", refers to contacting the photoresist film to a gas phase basic compound under substantially controlled conditions to produce the desired photoresist pattern, e.g., a substantially vertical photoresist pattern. For example, contacting the photoresist film to a known concentration of the gas phase basic compound for a predetermined or desired period of time. It should be appreciated that this is significantly different from exposure of the photoresist film to an ambient amine compound which can be present in the atmosphere, because the concentration of ambient amine compound is typically not measured and/or can not be controlled to produce a substantially vertical photoresist pattern.

As used herein, the term "substantially vertical pattern" refers to a photoresist pattern in which the angle from substrate to pattern is 80–90 degrees.

Preferably, the gas phase basic compound is selected from the group consisting of an amine compound, an amide compound, urethane and urea. More preferably, the gas phase basic compound is an amine compound. And most preferably, the gas phase basic compound is ammonia.

Another aspect of the present invention provides a process for forming a photoresist pattern comprises treating a photoresist composition coated substrate, which has been exposed to light using an exposer, with a gas phase basic compound under conditions sufficient to produce a substantially vertical photoresist pattern.

In one particular embodiment a process for forming a photoresist pattern comprises the steps of:

(a) coating a photoresist composition on a substrate to form a coated substrate;

(b) exposing the coated substance to light using an exposer to produce an exposed substrate;

(c) treating the exposed substrate with gas phase basic compound to produce treated substrate; and (d) developing the treated substrate, wherein the step of treating exposed substrate results in production of a substantially vertical photoresist pattern.

The disclosed process will now be described in reference to an amine basic subsequent description presumes that the basic gas employed is an amine gas.

The disclosed process will be described with regard to using an amine gas phase compound to treat the photoresist film to produce a substantially vertical photoresist pattern. It should be noted that the following description of the disclosed process assists in illustrating various features of the present invention and are provided for the purpose of illustrating the practice of the disclosed process and do not constitute limitations on the scope thereof.

In step (c), the exposed substrate is treated in a gas chamber comprising a gas phase amine compound. The amine concentration in the gas chamber can vary depending on a variety of factors such as temperature and the photoresist composition used. The treatment time can also vary depending on a variety of factors enumerated above as well the concentration of the amine compound in the chamber. Typically, however, the amine concentration in the chamber is from about 1 to about 5 ppb. And a typical treatment time is from about 20 to about 60 seconds.

Figure 1B:
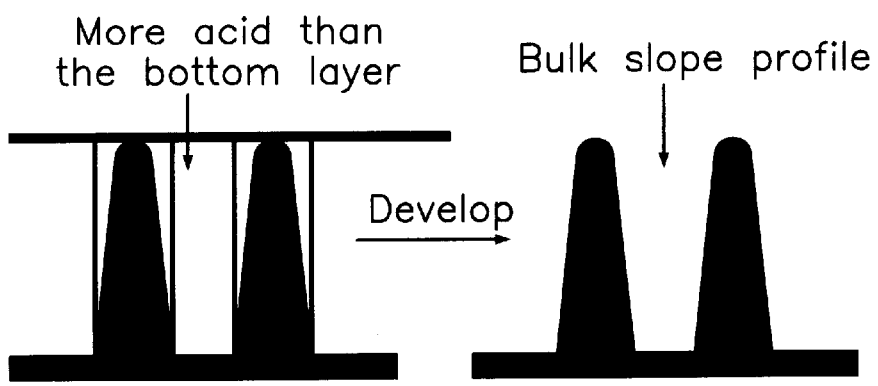
FIG. 1b shows a pattern profile obtained using a high light absorbance photoresist resin.

Without being bound by any theory, it is believed that a low transmittance photoresist resin generates more acid in the upper portion of the photoresist film than in the bottom portion, such a photoresist resin typically results in a sloped photoresist pattern as illustrated in FIG. 1b. As used herein, the term "low transmittance photoresist resin" refers to a photoresist resin having a high light absorbance in the upper portion of the photoresist film such that only a relatively small amount of light penetrates into the bottom portion of the photoresist film.

It is believed that during the amine treatment, the amine diffuses or penetrates into the photoresist film and neutralizes at least some of the acids in the upper portion of the photoresist film, thus resulting in a more uniform acid concentration throughout the photoresist film depth. For example, during an amine treatment, a large amount of amine compound is initially present in the upper portion of the photoresist film relative to the bottom portion of the photoresist film. It is believed that at least a portion of this amine compound is neutralized by the acids that are generated by photolysis. As a result, there is a gradual decrease in the amount of amine compound diffusing into the lower portion of the photoresist film. This decrease in the amount of amine compound through the depth of the photoresist film results in an amine compound gradient along the depth of the photoresist film which is believed to be responsible for reduction or prevention of the formation of a sloped photoresist pattern.

The disclosed process is useful in forming a substantially vertical fine photoresist pattern from any conventional photoresist composition which comprises a photoacid generator. Typically, the photoresist compositions that are used in the process of the present invention comprises a photoresist resin (i.e., polymer), a photoacid generator and an organic solvent. While the process of the present invention can be used with any conventional photoresist polymers, in one particular embodiment of the present invention, the photoresist resin is poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

The disclosed process can also include heating (i.e., baking) the coated substrate (i.e., before step (b)), treated substrate (i.e., after step (c)), or combinations thereof. Typically, the substrate is heated to temperature of about 100 to about 200° C.

Exemplary light sources (i.e., exposers) which are useful for forming the photoresist pattern include light sources which generate light having wavelength of about 250 nm or below. Preferred light sources include, but are not limited to, ArF (193 nm) exposer, KrF (248 nm) exposer, $F_2$ (157 nm) exposer, EUV (13 nm) exposer, E-beam, X-ray and ion beam.

Another aspect of the disclosed process provides a semiconductor element manufactured by the process described above.

Additional objects, advantages, and novel features of the disclosed process will become apparent to those skilled in the art upon examination of the following examples thereof, which are not intended to be limiting.

EXAMPLES

Measurement of Transmittance

Photoresist resin DHA1001 (a photoresist composition manufactured by Dong-jin Semichem Inc., Korea) comprising poly(tert-butyl bicyclo[2.2.1]hept-5-ene-2-carboxylate-2-hydroxyethyl bicyclo[2.2.1]hept-5-ene-2-carboxylate/bicyclo[2.2.1]hept-5-ene-2-carboxylic acid/maleic anhydride) was coated on a quartz-wafer. The coated wafer was baked at 150° C. for 90 seconds, and cooled to 23° C. (photoresist thickness: about 0.5 $\mu$m). The transmittance of the resulting photoresist resin measured using JASCO VUV 200 spectrometer was 45%.

Comparative Example I

Figure 2:
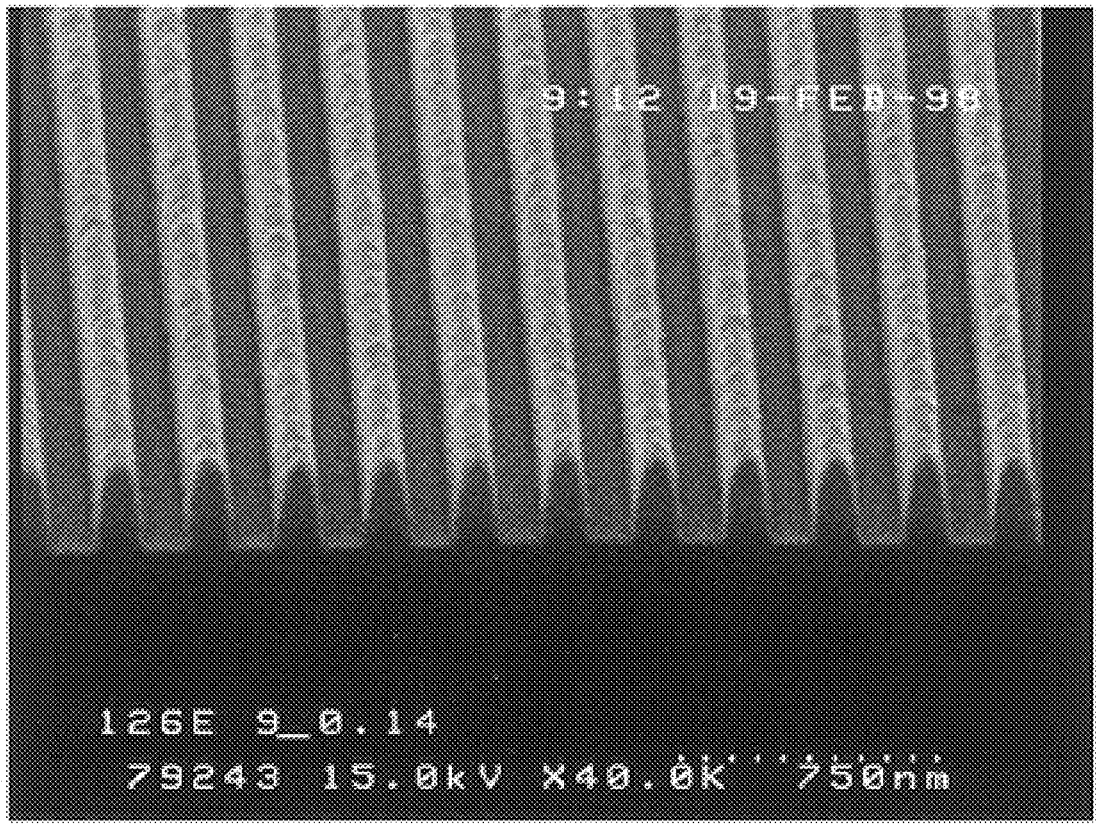
FIG. 2 shows a photoresist pattern obtained in Comparative Example 1.

At an environmental amine concentration of 1 ppb, the DHA1001 photoresist composition used in Example I was coated on the wafer at a thickness of about 0.4 $\mu$m, baked at 150° C. for 90 seconds, and cooled to 23° C. The coated photoresist was exposed to light using an ArF exposer, baked at 140° C. for 90 seconds, and developed in 2.38 wt % TMAH solution to produce a 140 nm L/S pattern. As shown in FIG. 2, the photoresist pattern was severely sloped. It is believed that this was due to the low transmittance of the photoresist composition.

Invention Example I

Figure 3:
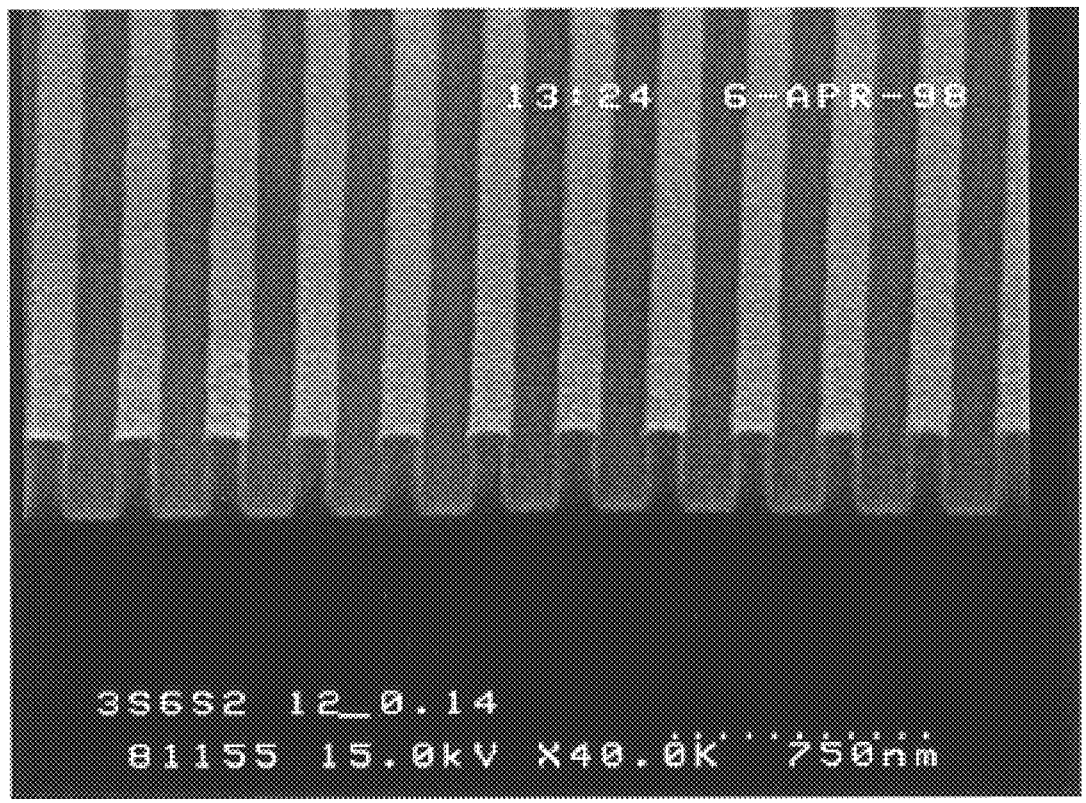
FIG. 3 shows a photoresist pattern obtained in Invention Example 1.

At an environmental amine concentration of I ppb, the DKA1001 photoresist composition used in Example I was coated on the wafer at a thickness of about 0.4 $\mu$m, baked at 150° C. for 90 seconds, and cooled to 23° C. The coated photoresist was exposed to light using an ArF exposer and treated with a gas phase amine for 30 seconds in an amine chamber at an amine concentration of 3 ppb. The treated water was post-baked at 140° C. for 90 seconds, and developed in 2.38 wt % TMAH solution to produce a 140 nm L/S pattern. As shown in FIG. 3, although the DHA1001 photoresist has a low transmittance, a vertical pattern was formed when the exposed photoresist was treated with a gas phase amine compound.

As the comparison of Comparison Example I and Invention Example I shows, when the exposed photoresist film is treated with a gas phase amine compound, it is believed that the amine compound penetrates into the photoresist film layer, thereby providing an amine gradient within the photoresist film. Accordingly, a proportionally large amount of acid in the upper portion of the photoresist film is neutralized and produces a substantially vertical photoresist pattern even when the photoresist resin has a light low transmittance (i.e., high light absorbance).

The foregoing discussion of the invention has been presented for purposes of illustration and description. The foregoing is not intended to limit this disclosure to the form or forms disclosed herein. Although the description of the disclosed process has included description of one or more embodiments and certain variations and modifications, other variations and modifications are within the scope of the this disclosure, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A process for forming a photoresist pattern comprising the steps of treating an exposed photoresist substrate with ammonia gas under conditions sufficient to produce a substantially vertical photoresist pattern prior to developing the pattern.

2. The process of claim 1 wherein the treating of the exposed photoresist substrate with ammonia gas is further characterized as neutralizing acid existing in an upper portion of the exposed photoresist substrate.

3. A process for forming a photoresist pattern, comprising the steps of:

(a) coating a photoresist composition on a substrate to produce a coated substrate;

(b) exposing said coated substrate to light using an exposer to produce an exposed substrate;

(c) treating said exposed substrate with ammonia gas to produce a treated substrate; and (d) developing said treated substrate to produce said photoresist pattern, wherein said step of treating exposed substrate results in production of a substantially vertical photoresist pattern.

4. The process of claim 3, wherein said step of treating exposed substrate comprises placing said exposed substrate in a chamber comprising said ammonia gas.

5. The process of claim 4, wherein the concentration of said ammonia gas ranges from about 1 to about 5 ppb.

6. The process according to claim 3, wherein said exposed substrate is treat with said ammonia gas for a period ranging from about 20 to about 60 seconds.

7. The process of claim 3, wherein said photoresist composition comprises a photoresist polymer, a photoacid generator and an organic solvent.

8. The process of claim 7, wherein said photoresist polymer is poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

9. The process of claim 3, further comprising the steps of heating said coated substrate, treated substrate, or combinations thereof.

10. The process of claim 9, wherein the temperature of ranges from about 100 to about 200° C.

11. The process of claim 3, wherein said exposer is 193 nm wavelength ArF exposer, 248 nm wavelength KrF exposer, 157 nm wavelength $F_2$ exposer, 13 nm wavelength EUV exposer, B-beam, X-ray or ion beam.

12. The process of claim 3 wherein part (b) is further characterized as exposing said coated substrate to light using an exposure to produce an exposed substrate having acid existing in an upper portion of the exposed substrate and part (c) is further characterized as treating said acid existing predominately in the upper portion of the exposed substrate with ammonia gas to produce a treated substrate and neutralize the acid previously existing in the upper portion of the exposed substrate.

* * * * *

UNITED STATES PATENT AND TRADEMARK OFFICE
CERTIFICATE OF CORRECTION

PATENT NO.     : 6,664,031 B2
DATED          : December 16, 2003
INVENTOR(S)    : Jae Chang Jung et al.

It is certified that error appears in the above-identified patent and that said Letters Patent is hereby corrected as shown below:

Title page,
Item [75], Inventors, please delete "Sungnam-shi" and replace with -- Kyoungki-do --; and please delete "Ichon-shi" and replace with -- Kyoungki-do --.

Signed and Sealed this

Thirtieth Day of March, 2004

JON W. DUDAS
*Acting Director of the United States Patent and Trademark Office*